(12) United States Patent
Akhlaghi Esfahany et al.

(10) Patent No.: US 8,445,304 B2
(45) Date of Patent: May 21, 2013

(54) SEMI-CONDUCTOR SENSOR FABRICATION

(75) Inventors: Siamak Akhlaghi Esfahany, Edmonton (CA); Yan Loke, Edmonton (CA)

(73) Assignee: Micralyne Inc., Edmonton, Alberta (CA)

( * ) Notice: Subject to any disclaimer, the term of this patent is extended or adjusted under 35 U.S.C. 154(b) by 0 days.

(21) Appl. No.: 13/318,709

(22) PCT Filed: Jun. 1, 2010

(86) PCT No.: PCT/CA2010/000842
§ 371 (c)(1),
(2), (4) Date: Jan. 16, 2012

(87) PCT Pub. No.: WO2010/139067
PCT Pub. Date: Dec. 9, 2010

(65) Prior Publication Data
US 2012/0119311 A1    May 17, 2012

Related U.S. Application Data

(60) Provisional application No. 61/183,170, filed on Jun. 2, 2009.

(51) Int. Cl.
*H01L 21/00* (2006.01)

(52) U.S. Cl.
USPC ............... 438/50; 438/51; 438/52; 438/53; 257/415; 257/417

(58) Field of Classification Search
USPC .............. 438/50–53; 257/415, 417, E29.324, 257/E21.002
See application file for complete search history.

(56) References Cited

U.S. PATENT DOCUMENTS

| | | | |
|---|---|---|---|
| 7,041,225 B2 | 5/2006 | Lutz | |
| 7,232,754 B2 * | 6/2007 | Kirby et al. | 438/667 |
| 2006/0275946 A1 | 12/2006 | MacNamara et al. | |
| 2007/0218585 A1 * | 9/2007 | Robert | 438/106 |
| 2008/0079120 A1 | 4/2008 | Foster et al. | |
| 2008/0160679 A1 | 7/2008 | Colgan et al. | |
| 2009/0212407 A1 | 8/2009 | Foster et al. | |

* cited by examiner

Primary Examiner — Theresa T Doan
(74) Attorney, Agent, or Firm — Bennett Jones LLP

(57) ABSTRACT

Methods of fabricating semiconductor sensor devices include steps of fabricating a hermetically sealed MEMS cavity enclosing a MEMS sensor, while forming conductive vias through the device. The devices include a first semi-conductor layer defining at least one conductive via lined with an insulator and having a lower insulating surface; a central dielectric layer above the first semiconductor layer; a second semiconductor layer in contact with the at least one conductive via, and which defines a MEMS cavity; a third semiconductor layer disposed above the second semiconductor layer, and which includes a sensor element aligned with the MEMS cavity; a cap bonded to the third semiconductor to enclose and hermetically seal the MEMS cavity; wherein the third semiconductor layer separates the cap and the second semiconductor layer.

7 Claims, 6 Drawing Sheets

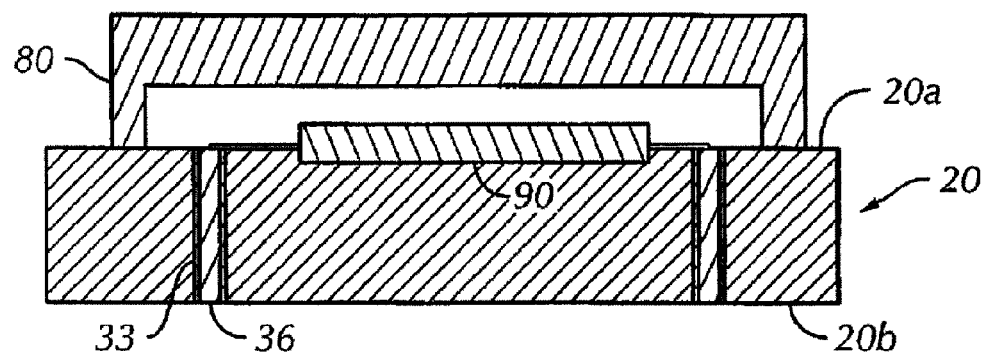
Fig. 1 – Prior Art
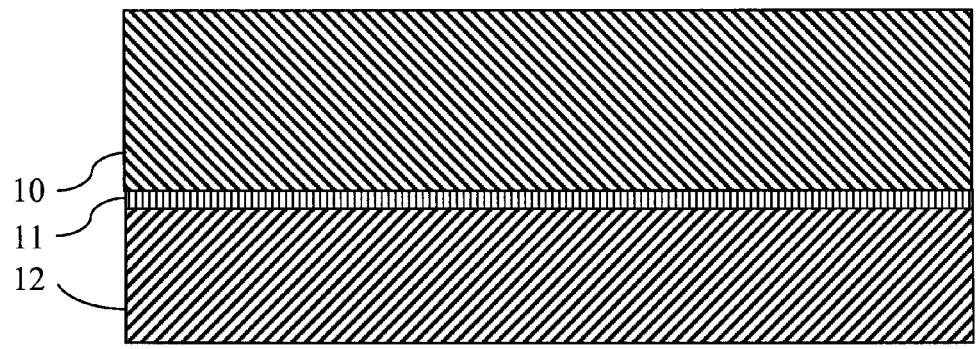
Fig. 2
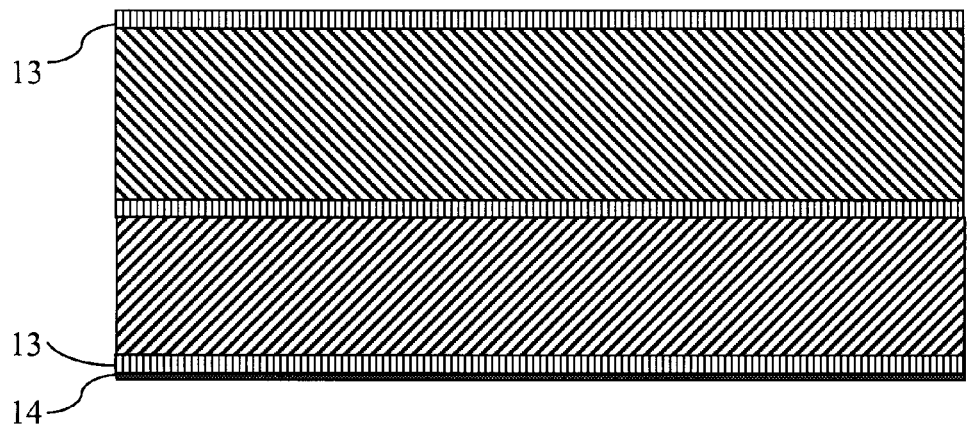
Fig. 3

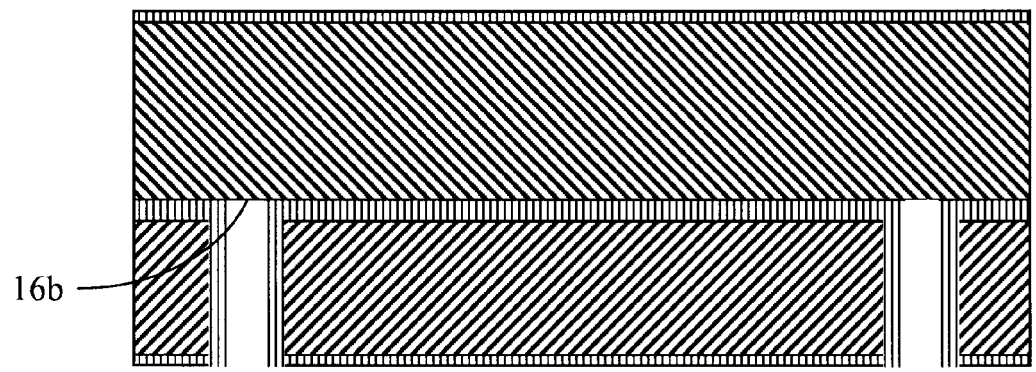
Fig. 6
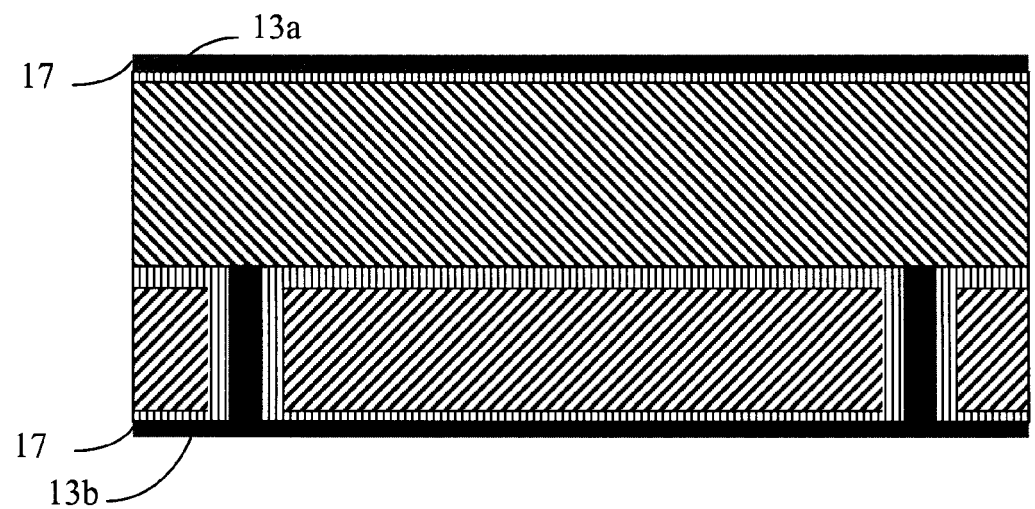
Fig. 7
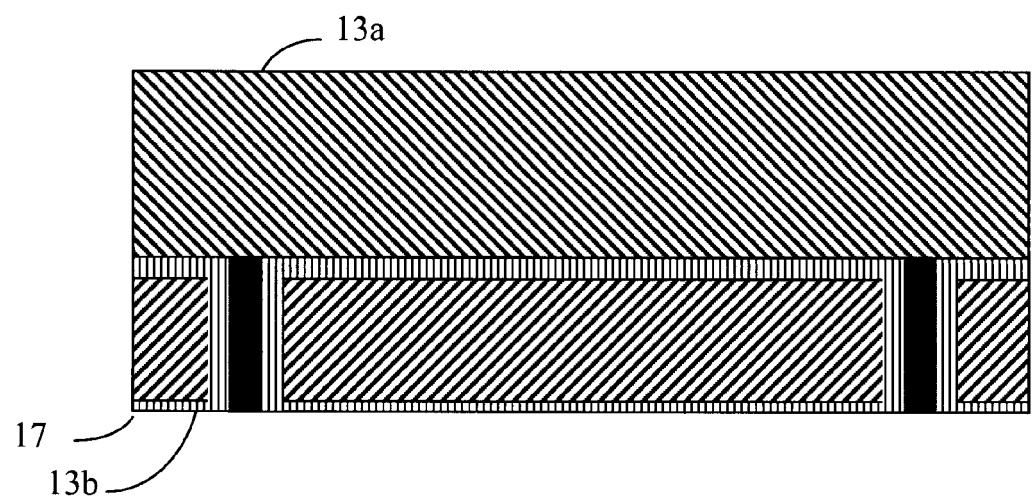

Fig. 8
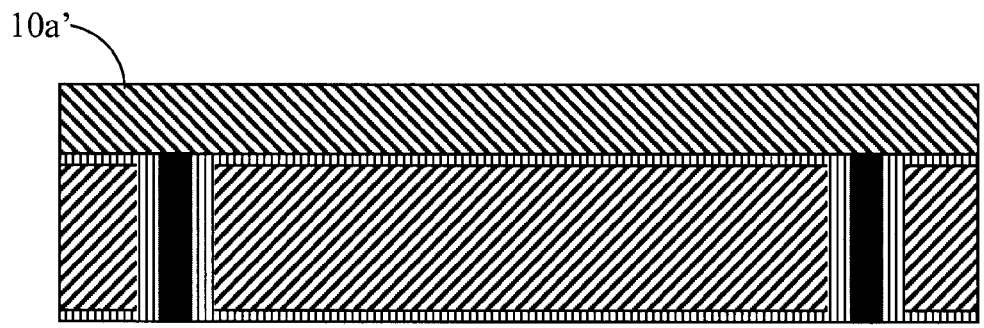
Fig. 9
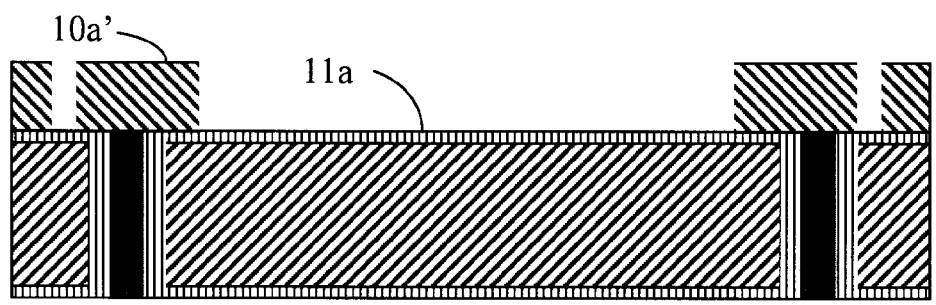
Fig. 10
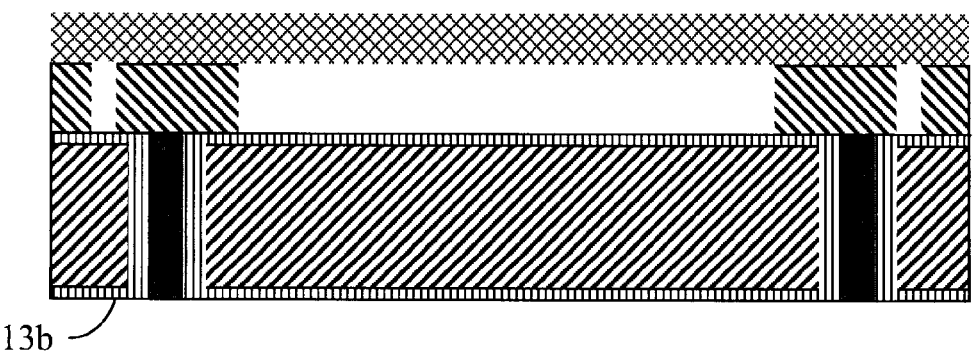
Fig. 11

SEMI-CONDUCTOR SENSOR FABRICATION

CROSS REFERENCE TO RELATED APPLICATIONS

This application is the National Phase of International Application No. PCT/CA2010/000842, filed Jun. 1, 2010, which claims the benefit of U.S. patent application No. 61/183,170, filed Jun. 2, 2009, the contents of which are incorporated herein by reference.

FIELD OF THE INVENTION

The present invention is directed to a method of fabricating a semi-conductor sensor.

BACKGROUND

Micro-electro-mechanical systems (MEMS) has led to the creation of a wide variety of small and fragile electrical components such as sensor technologies. Presently, these MEMS sensors are not typically compatible with standard integrated circuit (IC) packaging technologies because of their fragility. Some have considered going to wafer level packaging for such MEMS sensors, where the MEMS sensor is encapsulated as part of typical clean room processing by a bonding method such as using direct wafer bonding or anodic bonding of a glass or silicon protective cap over the MEMS sensor.

One prior art method involves mounting a MEMS sensor to a silicon wafer or substrate and enclosing the MEMS sensor with a glass or silicon cap, such as the method described in US Patent Application No. 2006/0275946 A1, the contents of which are incorporated herein by reference, where permitted. An electrical lead is run across the surface of the substrate from the MEMS sensor or other electrical component. Routing the electrical connection through the cap is difficult and the interface between the cap and the electrical connector often leads to an imperfect seal or problems with conductivity of the electrical connector.

There is a need in the art for a semiconductor device having through-wafer conductive vias for connecting to an electrical component such as a MEMS sensor from beneath or above the semiconductor substrate. It is also desirable to form the through-wafer conductive vias using the semiconductor substrate material itself so as to minimize a fill process.

SUMMARY OF THE INVENTION

In one aspect, the invention comprises a method of fabricating a MEMS device comprising the steps of:
(a) growing or depositing an insulation layer on a top surface and a bottom surface of an engineered substrate comprising an upper and a lower layer of a semiconductor, sandwiching a central dielectric layer therebetween;
(b) etching the lower semiconductor layer, thereby creating at least one via through the lower semiconductor layer and exposing the central dielectric layer;
(c) lining the at least one via with an insulator;
(d) etching the central dielectric layer exposed through the via, to expose the upper semiconductor layer through the at least one via;
(e) filling the via with a conductive material;
(f) forming a MEMS cavity in the upper semiconductor layer by etching the upper surface of the upper semiconductor layer;
(g) bonding a third semiconductor layer to the upper semiconductor layer;
(h) etching the third semiconductor layer to form the MEMS device; and
(i) capping the MEMS cavity with a semiconductor cap hermetically sealed to the third semiconductor layer.

In one embodiment, the method further comprises the step of metallizing a periphery of the MEMS cavity to form a conductive bonding ring, which bonds to the semiconductor cap. In one embodiment, the method further comprises the step of growing or depositing a layer of doped polysilicon on the bottom insulation layer formed in step (a) and creating the at least one via by etching both the doped polysilicon layer and lower semiconductor layer to the central dielectric layer.

In another aspect, the invention comprises a semiconductor sensor device comprising:
(a) a first semi-conductor layer defining at least one conductive via lined with an insulator and having a lower insulating surface;
(b) a central dielectric layer above the first semiconductor layer;
(c) a second semiconductor layer in contact with the at least one conductive via, and which defines a MEMS cavity;
(d) a third semiconductor layer disposed above the second semiconductor layer, and which includes a sensor element aligned with the MEMS cavity;
(e) a cap bonded to the third semiconductor to enclose and hermetically seal the MEMS cavity;
wherein the third semiconductor layer separates the cap and the second semiconductor layer.

In one embodiment, the device comprises an accelerometer.

BRIEF DESCRIPTION OF THE DRAWINGS

In the drawings, like elements are assigned like reference numerals. The drawings are not necessarily to scale, with the emphasis instead placed upon the principles of the present invention. Additionally, each of the embodiments depicted are but one of a number of possible arrangements utilizing the fundamental concepts of the present invention. The drawings are briefly described as follows:

FIG. 1 (PRIOR ART) is a schematic representation of a prior art MEMS device having through-wafer insulated silicon vias with polysilicon conductive material.

FIG. 2 shows a cross-sectional view of the engineered substrate.

FIG. 3 shows a cross-sectional view of the substrate with added insulating and polysilicon layers.

FIG. 6 shows the insulated vias after etching through the buried insulator layer.

FIG. 7 shows the substrate after the via is filled with a conductive material.

FIG. 8 shows the substrate after removal of excess conductive material.

FIG. 9 shows the substrate after thinning of the top wafer.

FIG. 10 shows the substrate after the sensor cavity is etched into the top wafer.

FIG. 11 shows the substrate with the third wafer added.

DETAILED DESCRIPTION OF PREFERRED EMBODIMENTS

Figure 4A:
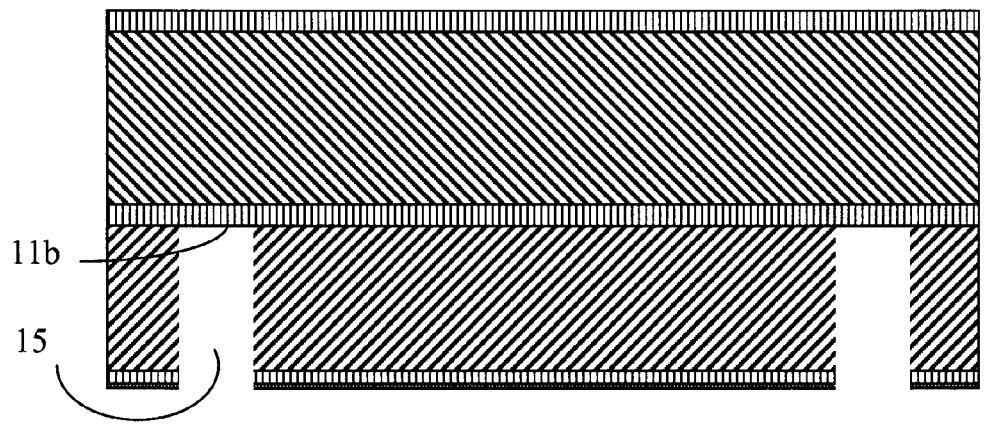
FIG. 4a shows a cross-sectional view of the substrate following formation of the vias.

The invention relates to an engineered semi-conductor sensor and a method of fabricating the same. When describing the present invention, all terms not defined herein have their common art-recognized meanings. To the extent that the following description is of a specific embodiment or a particular use of the invention, it is intended to be illustrative only, and not limiting of the claimed invention. The following description is intended to cover all alternatives, modifications and equivalents that are included in the spirit and scope of the invention, as defined in the appended claims.

Certain terminology is used in the following description for convenience only and is not limiting. The words "right", "left", "lower" or "bottom", and "upper" or "top" designate directions in the drawings to which reference is made. The words "inwardly" and "outwardly" refer direction toward and away from, respectively, the geometric center of the object described and designated parts thereof. The terminology includes the words above specifically mentioned, derivatives thereof and words of similar import.

The need to reach high and stable values of the Q-factor is one of the most important issues of resonant MEMS in order to make high-performance sensors. The Q-factor is strongly influenced by the internal environment of the MEMS packaging, by total pressure and by gas composition. The present invention provides a method of fabricating a hermetically sealed device using known MEMS sensor materials.

The MEMS sensor device may comprise any MEMS hermetically bonded devices such as, but not limited to, gyroscopes, accelerometers, pressure and flow sensors, IR sensors, RF-MEMS and optical mirrors, which are all within the scope of the present invention.

FIG. 1 shows a schematic of a prior art through-wafer insulated silicon vias (36) with polysilicon conductive material. In this case, the vias (36) are exposed on the bottom side by planarization of the lower semiconductor surface (20b). The sensor (90) is connected to the vias by short leads, and is enclosed with cap (80).

In one aspect, the present invention comprises novel semiconductor devices including conductive vias and an enclosed MEMS chamber. In another aspect, the invention may comprises a method of forming a semi-conductor device having conductive vias and an enclosed MEMS chamber.

As shown in FIG. 2, fabrication of a semi-conductor device may begin with an engineered substrate having two layers (10, 12) of semiconductor, such as silicon, with a buried central layer of insulator or dielectric (11) in between. Fabrication of the engineered substrate (10, 11, 12) is well known and need not be further described herein. The insulator may be any known suitable insulating material, including an oxide material, for example, silicon dioxide.

As shown in FIG. 3, an insulation layer (13) is grown or deposited on both top and bottom of the engineered substrate. The insulation layer (13) is preferably, but not necessarily the same material as the insulator (11) disposed between the semi-conductor layers (10, 12). The insulation layer (13) may be deposited using low pressure chemical vapor deposition, tetraethylorthosilicate (TEOS) or a spun-on-glass (SOG) deposition technique or any other oxide deposition technique as is known in the art.

In one embodiment, a layer of doped polysilicon (14) is then grown or deposited on the bottom. This layer (14) is destined for removal in certain embodiments of the subsequent etching step, and in alternative embodiments may be omitted from the process. When used, this layer (14) serves as a very hard mask.

The electrical characteristics of a polysilicon thin film depends on its doping. Heavier doping results in lower resistivity. Polysilicon is more resistive than single-crystal silicon for any given level of doping mainly because the grain boundaries in polysilicon hamper carrier mobility. Common dopants for polysilicon include, for example, arsenic, phosphorus, and boron. Polysilicon is usually deposited undoped, with the dopants just introduced later on after deposition.

Methods of doping polysilicon are well known and include, for example, diffusion, ion implantation, and in situ doping. Diffusion doping consists of depositing a very heavily-doped silicon glass over the undoped polysilicon. This glass will serve as the source of dopant for the polysilicon. Dopant diffusion takes place at a high temperature, i.e., 900-1000° C. Ion implant is more precise in terms of dopant concentration control and consists of directly bombarding the polysilicon layer with high-energy ions. In situ doping consists of adding dopant gases to the CVD reactant gases during the deposition process.

Figure 4B:
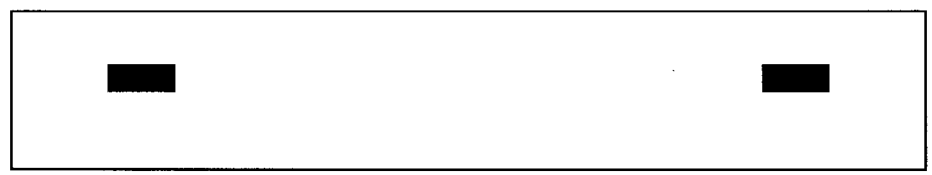
FIG. 4b shows a horizontal cross-sectional view showing one example of placement of the vias.

As shown in FIG. 4A, the lower surface of the engineered substrate is then etched using conventional and well-known techniques to the bottom surface (11b) of the buried central insulation layer (11). FIG. 4B shows the top-down view of the etched vias (15), which is shown as a rectangular area to maximize surface area and minimize resistance for the conductive vias. The etch may be, for example, a chemical etch, a plasma etch, or a reactive ion etch (RIE). The number of vias (15) and spacing between vias may be varied as desired, and are not limited by exemplary configuration shown in the Figures.

Figure 5:
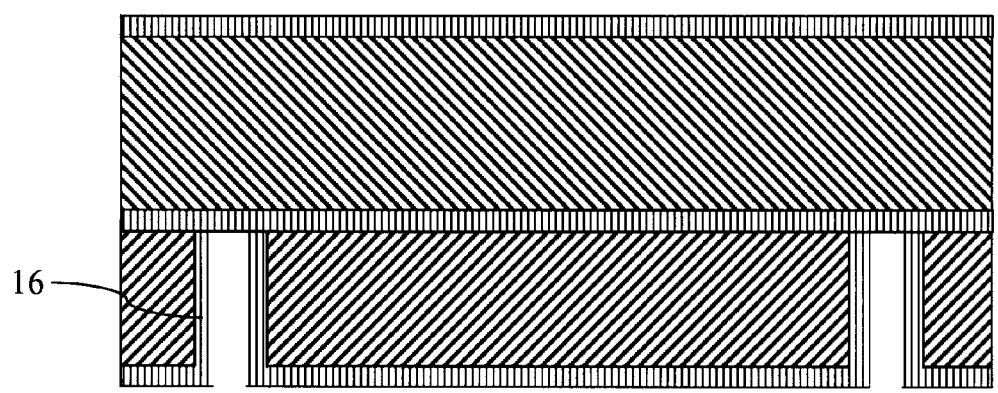
FIG. 5 shows the vias after growth of an insulating layer.

After removing the polysilicon layer (14), as shown in FIG. 5, a via lining insulator (16) is again grown or deposited on the top and bottom of the engineered substrate and to line the vias, for electrical isolation. This insulator is preferably, but not necessarily the same insulating material as the buried insulating layer (11). In one embodiment, the via lining insulator (16) may be silicon dioxide grown through a thermal oxidation process.

As shown in FIG. 6, the engineered substrate is further etched to remove the portion of the buried central insulation layer exposed by the via, to the lower surface (16b) of the upper semiconductor layer (10), thereby exposing the upper semiconductor layer (10) through the via (15).

As shown in FIG. 7, a conductive material is then deposited in the vias, which may be, for example, a doped polysilicon. The polysilicon is doped to have an N-type or P-type nature, such as by introducing boron, phosphorus or antimony atoms, to increase conductivity and have lower resistance along the via. As used herein, reference to conductivity is for convenience only. However, those skilled in the art are aware that a P-type conductivity can be switched with an N-type conductivity and that the device would still function correctly. Therefore, where used herein, reference to N or P can also mean either N or P, and that P and N can be substituted for each other.

The top (13a) and bottom (13b) surfaces of the engineered substrate may then be planarized to remove polysilicon, leaving an exposed semi-conductive material on the top surface (13a), and an insulating layer on the bottom surface (13b), which is interrupted by the conductive vias (15), as shown in FIG. 8. In one embodiment, the top (13a) of the wafer may then be thinned using conventional techniques, such as by grinding and polishing, to create an upper semiconductor layer of a defined depth.

Following thinning, the top semiconductor surface (10a) of the engineered substrate is etched to the buried insulation layer (11a), to create a cavity for MEMS devices, such as sensors, as shown in FIG. 10.

Figure 12:
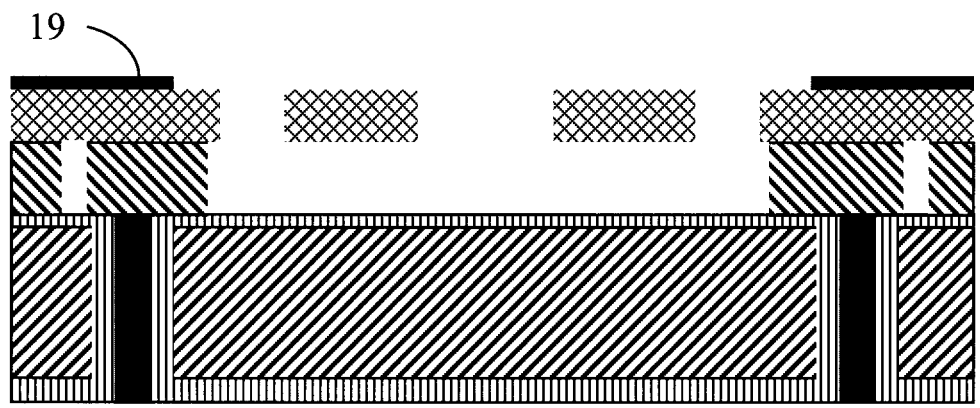
FIG. 12 shows the metal bonding ring.
Figure 13:
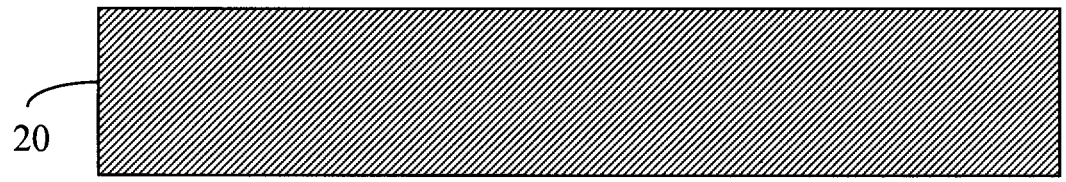
FIG. 13 shows the capping substrate.

Once the sensor cavity is formed, a third semiconductor wafer (18), such as silicon, may be bonded to the engineered substrate, such as by silicon fusion bonding, as shown in FIG. 11. Before the sensor is formed by etching, a bonding ring (19) may be formed by metallizing with a suitable metal or alloy, such as Ti/Pt/Au, as shown in FIG. 12. The metal or alloy bonding ring (19) may be deposited by any conventional technique, such as by evaporation. The bonding ring (19) extends around the periphery of the device and creates a conductive seal between the sensor body and the capping semiconductor substrate (20).

The top surface of the third semiconductor wafer (18) is then etched through to the underlying upper semiconductor layer (10) to form the desired MEMS actuator or sensor, such as an accelerometer.

The etching of the third semi-conductor wafer is preferably performed by a deep reactive ion etch (DRIE), however, other suitable etching methods may be suitable for different applications. DRIE is a preferred method of etching the third semiconductor layer for more sensitive and less forgiving applications, such as the formation of very sensitive sensors, such as an accelerometer.

Figure 14:
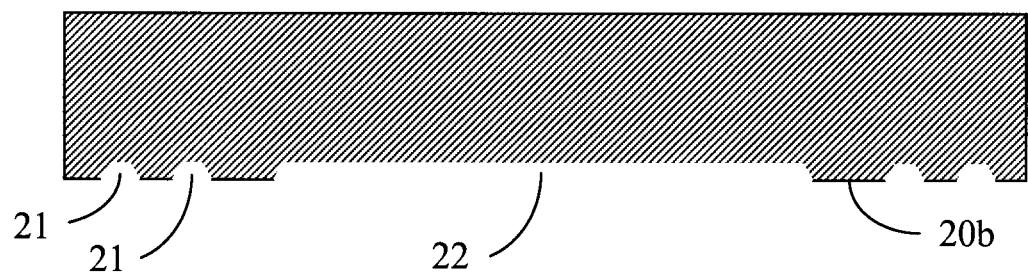
FIG. 14 shows the capping substrate after etching the getter cavity and bonding surface.
Figure 15:
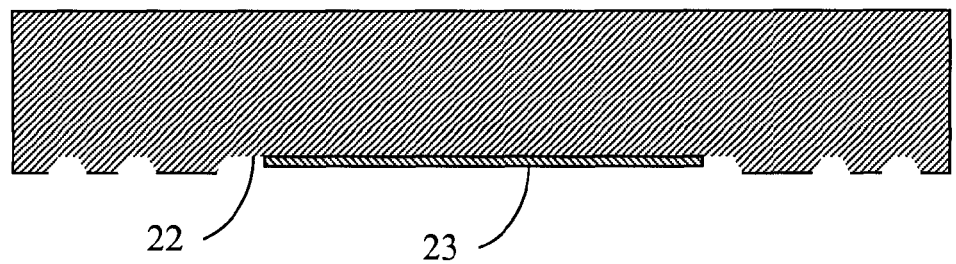
FIG. 15 shows the capping substrate after getter deposition.

The capping semiconductor substrate (20) may be separately formed from a suitable material such as silicon. In one embodiment, the periphery may be etched, in this case using an isotropic process, to form grooves (21) which assist the bonding process to the bonding ring (19). FIGS. 14 and 15 also shows the etched region (22) for the gap between the sensor and capping substrate, where the getter material (23) will be deposited, in one embodiment.

In one embodiment, the getter (23) is provided to chemically absorb active gases in the sensor cavity for the lifetime of the devices. The getter material (23) is well known and may be deposited or printed on the capping substrate surface (22a) using well known techniques.

Figure 16:
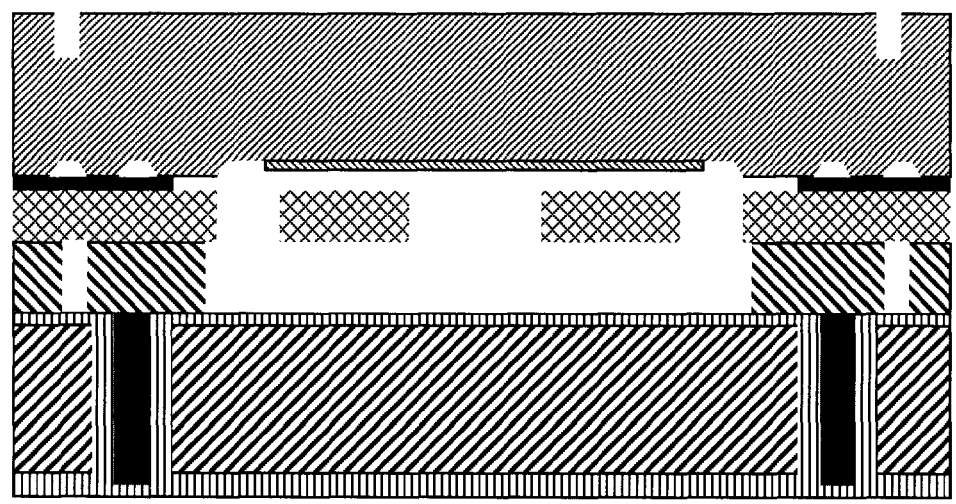
FIG. 16 shows the device after bonding the capping substrate to the engineered substrate.

The engineered substrate and capping substrate are then bonded to connect surfaces 19a and 20b, using a suitable bonding technique such as a eutectic process, and the getter is activated. As shown in FIG. 16, the device is sealed mechanically and hermetically by the metal bonding ring (19), and the getter adsorbs additional atoms away from the MEMS device.

Figure 17:
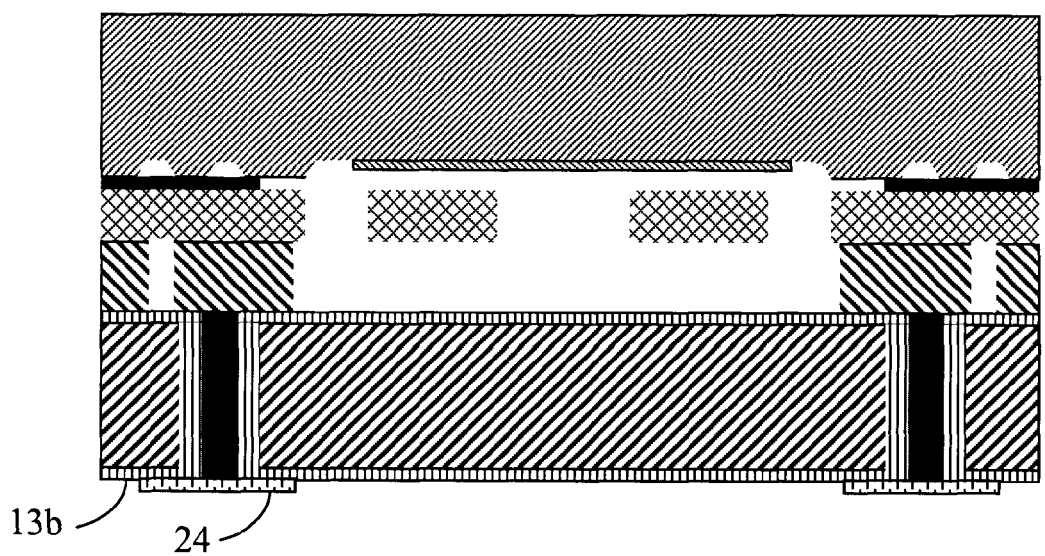
FIG. 17 shows the device after formation of the metallized bonding pads.

As shown in FIG. 17, contact pads (24) are formed on the bottom surface 13b by first selective removal of a portion the oxide layer to expose the bottom portion of the vias, followed by metallization over top of the vias, allowing for connection from the MEMS device, to the conductive via, and finally to outside the package for external assembly such as soldering to a circuit board.

As will be apparent to those skilled in the art, various modifications, adaptations and variations of the foregoing specific disclosure can be made without departing from the scope of the invention claimed herein.

What is claimed is:

1. A method of fabricating a MEMS device comprising the steps of:
   (a) growing or depositing an insulation layer on a top surface and a bottom surface of an engineered substrate comprising an upper and a lower layer of a semiconductor, sandwiching a central dielectric layer therebetween;
   (b) etching the lower semiconductor layer, thereby creating at least one via through the lower semiconductor layer and exposing the central dielectric layer;
   (c) lining the at least one via with an insulator;
   (d) etching the central dielectric layer exposed through the via, to expose the upper semiconductor layer through the at least one via;
   (e) filling the via with a conductive material;
   (f) forming a MEMS cavity in the upper semiconductor layer by etching the upper surface of the upper semiconductor layer;
   (h) bonding a third semiconductor layer to the upper semiconductor layer;
   (j) etching the third semiconductor layer to form the MEMS device; and
   (j) capping the MEMS cavity with a semiconductor cap hermetically sealed to the third semiconductor layer.

2. The method of claim 1 further comprising the step of metallizing a periphery of the MEMS cavity to form a conductive bonding ring, which bonds to the semiconductor cap.

3. The method of claim 1 further comprising the step of growing or depositing a layer of doped polysilicon on the bottom insulation layer formed in step (a) and creating the at least one via by etching both the doped polysilicon layer and lower semiconductor layer to the central dielectric layer.

4. The method of claim 1 wherein the insulator lining the via comprises the same material as the central dielectric layer.

5. The method of claim 1 wherein any one or more of the growth or deposition steps comprises a method of low pressure chemical vapor deposition, tetraethylorthosilicate (TEOS) or a spun-on-glass (SOG) deposition.

6. The method of claim 2 further comprising the step of etching a portion of the semiconductor cap which contacts the bonding ring to assist bonding of the cap to the bonding ring.

7. The method of claim 1 wherein any one of the etching steps comprises a chemical etch, a plasma etch, a reactive ion etch, or a deep reactive ion etch.

* * * * *